(12) United States Patent  (10) Patent No.: US 7,186,968 B2
Raynor  (45) Date of Patent: Mar. 6, 2007

(54) POLARIZATION SENSITIVE SOLID STATE IMAGE SENSOR INCLUDING INTEGRATED PHOTODETECTOR AND POLARIZING ASSEMBLY AND ASSOCIATED METHODS

(75) Inventor: Jeffrey Raynor, Edinburgh (GB)

(73) Assignee: STMicroelectronics Ltd., Buckinghamshire (GB)

( * ) Notice: Subject to any disclaimer, the term of this patent is extended or adjusted under 35 U.S.C. 154(b) by 0 days.

(21) Appl. No.: 11/154,330

(22) Filed: Jun. 16, 2005

(65) Prior Publication Data

US 2005/0279921 A1 Dec. 22, 2005

(30) Foreign Application Priority Data

Jun. 18, 2004 (EP) .................................. 04253649

(51) Int. Cl.
- *G01J 1/44* (2006.01)
- *H01L 27/00* (2006.01)
- *G02B 5/30* (2006.01)
- *G02F 1/01* (2006.01)

(52) U.S. Cl. ............... 250/225; 250/214 R; 250/208.1; 359/486; 359/489

(58) Field of Classification Search ............... 250/225, 250/208.1, 214 R; 359/486, 489; 348/294, 348/300, 301
See application file for complete search history.

(56) References Cited

U.S. PATENT DOCUMENTS 6,020,583 A * 2/2000 Walowit et al. ............. 250/226

| 6,788,461 | B2* | 9/2004 | Kurtz et al. | 359/486 |
| 2002/0101659 | A1* | 8/2002 | Hansen et al. | 359/486 |
| 2003/0142400 | A1* | 7/2003 | Hansen et al. | 359/486 |
| 2004/0125449 | A1* | 7/2004 | Sales | 359/486 |
| 2004/0174596 | A1* | 9/2004 | Umeki | 359/484 |
| 2004/0218270 | A1* | 11/2004 | Wang | 359/489 |

OTHER PUBLICATIONS

Guo et al., "Fabrication of Thin-Film Micropolarizer Arrays for Visible Imaging Polarimetry", Applied Optics, vol. 39, No. 10, Apr. 2000, pp. 1486-1492.*

Chen, "A Novel Device for Detecting the Polarization Direction of Linear Polarized Light Using Integrated Subwavelength Gratings and Photodetectors", XP-000721228; vol. 9, No. 9 dated Sep. 1997; p. 1259-1261.

Doumuki et al., "An Aluminum-wire Grid Polarizer Fabricated on a Gallium-Arsenide Photodiode", XP000699633; American Institute of Physics, New York, vol. 71, No. 5 dated Aug. 4, 1997, pp. 686-688; ISSN: 003-6951.

Schnabel et al., "Study on Polarizing Visible Light by Subwavelength-period Metal-stripe Gratings", Optical Engineering, Soc. Of Photo-Optical Instrumentation Engineers, Bellingham, U.S., vol. 38, No. 2 dated Feb. 199; pp. 220-226, XP000955101, ISSN: 0091-3286.

(Continued)

*Primary Examiner*—Stephone B. Allen
*Assistant Examiner*—Davienne Monbleau
(74) *Attorney, Agent, or Firm*—Lisa K. Jorgenson; Allen, Dyer, Doppelt, Milbrath & Gilchrist, P.A.

(57) ABSTRACT

A polarization sensitive solid state image sensor includes an integrated photodetector and polarizing assembly. The polarizing assembly is formed directly on an upper dielectric surface of the photodetector as a metal grid. The integral form of the device improves polarization operation and reduces manufacturing costs.

13 Claims, 6 Drawing Sheets c/s A-A'

OTHER PUBLICATIONS

"A Monolithic Light-to-Frequency Converter with a Scalable Sensor Array", Aswell et al., Feb. 1, 2004, IEEE International Solid State Circuits Conference, IEEE Inc. New York, US, pp. 158-159, 329, XP000507099, ISSN: 0193-6530.

"Light-to-Frequency Converter using Integrating Mode Photodiodes", De Graaf et al., Jun. 4, 1996, Instrumentation and measurement Technology Conference, 1996. IMTC-96, Conference Proceedings. Quality Measurements: The Indispensable Bridge Between Theory and Reality., IEEE Brussels, Belgium Jun. 4-6, 1996, New York, NY, USA, IEEE, US, pp. 1072-1075, XP010164037, ISBN: 0-7803-3312-8.

* cited by examiner

POLARIZATION SENSITIVE SOLID STATE IMAGE SENSOR INCLUDING INTEGRATED PHOTODETECTOR AND POLARIZING ASSEMBLY AND ASSOCIATED METHODS

FIELD OF THE INVENTION

The present invention relates to the field of solid state image sensors, and, more particularly, to a polarization sensitive solid state image sensor, and method of forming the same.

BACKGROUND OF THE INVENTION

Current polarization sensitive solid state image sensors comprise a separately formed polarizing material which is mounted in the optical stack. However, the polarizing material is difficult to align accurately, and may also move during the sensor's operation, which can lead to derogation or loss of polarizing function.

Moreover, in a solid state image sensor manufacturing process, the step of aligning the polarizing material adds to the time taken and costs incurred. Furthermore, using existing technology, it is difficult or impractical to produce an image sensor with two or more regions which are sensitive to different polarizations of light, for example an image sensor that comprises a first horizontally polarized image sensor and a second, vertically polarized image sensor. At present, manufacture of such an image sensor would require the use of separate materials, and subsequent individual realignment on the sensor. It would be desirable to allow for the practical manufacture of several pixels, each with their own particular polarization sensitivity, on the same device.

SUMMARY OF THE INVENTION

According to a first aspect of the present invention, there is provided a polarization sensitive solid state image sensor comprising an integrated photodetector and polarizing assembly. The polarizing assembly can cover all or any portion of an image sensing surface of the image sensor. Preferably, the polarizing assembly comprises two or more regions which among them have two or more different polarizations.

The polarizing assembly comprises a plurality of parallel metal lines. The metal lines have a pitch of a value less than a wavelength in the spectral range of visible light. The pitch may be much greater than 30 nm. Also, the parallel lines may be spaced apart by a distance equal to their width. The photodetector may comprise a charge amplifier. Optionally, the photodetector comprises a light to frequency converter. The polarizing assembly may be formed on a dielectric material which is itself formed on the photodetector.

According to a second aspect of the present invention, there is provided a method of forming a polarization sensitive solid state image sensor comprising forming an integrated photodetector and polarizing assembly. The method comprises forming a photodetector having an upper dielectric layer and forming the polarizing assembly upon the dielectric layer. The plurality of parallel metal lines are formed by a lithographic or etching process.

From further aspects, the present invention provides for an integrated circuit, an optical mouse, a digital camera, and a mobile telephone incorporating a digital camera, each of which comprises a polarization sensitive solid state image sensor according to the first aspect, which can be formed by a method according to the second aspect.

BRIEF DESCRIPTION OF THE DRAWINGS

The present invention will now be described, by way of example only, with reference to the accompanying drawings, in which.

DETAILED DESCRIPTION OF THE PREFERRED EMBODIMENTS

Figure 1:
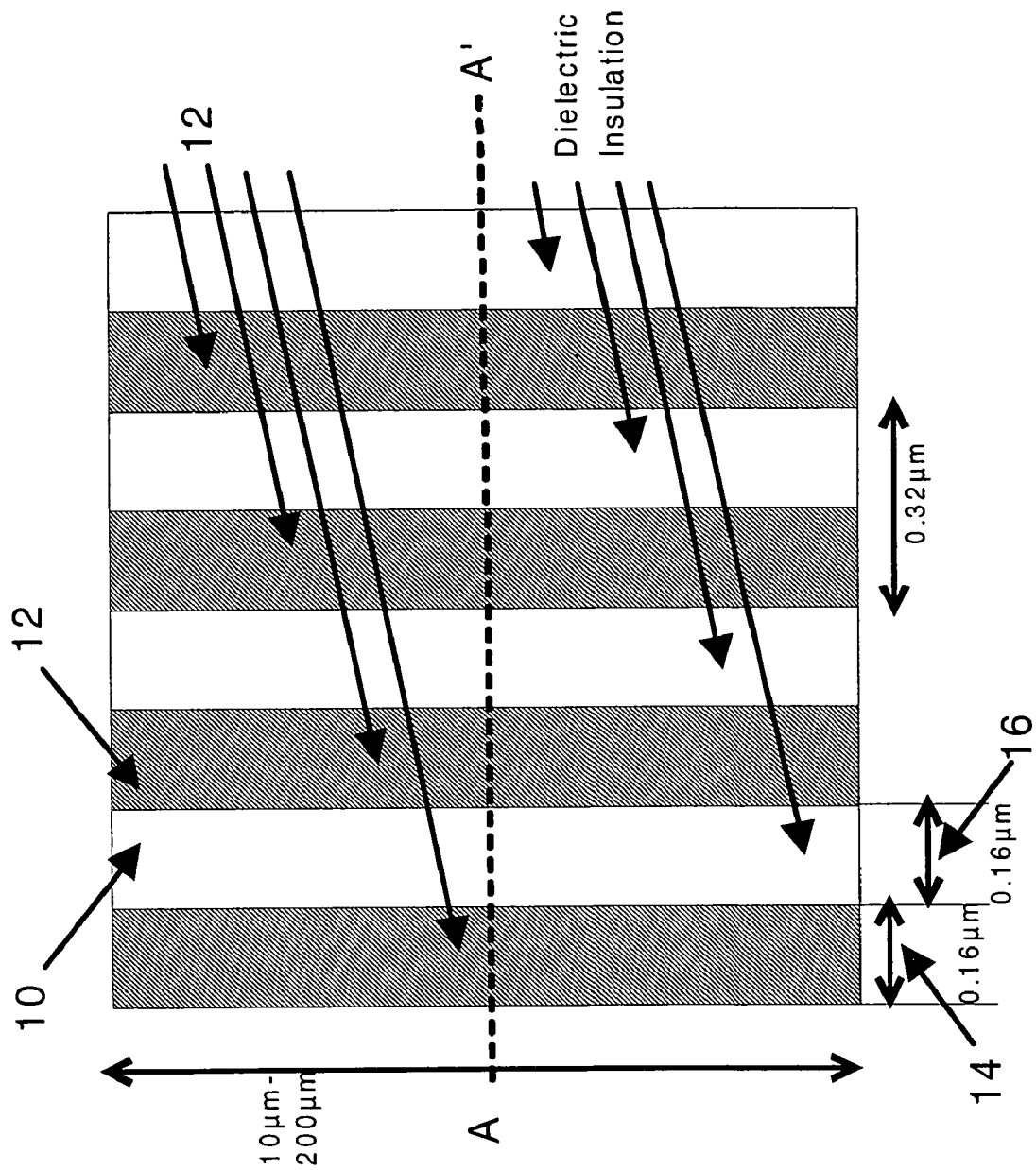
FIG. 1 is a schematic plan view illustrating an image sensor in accordance with a first embodiment of the invention.
Figure 2:
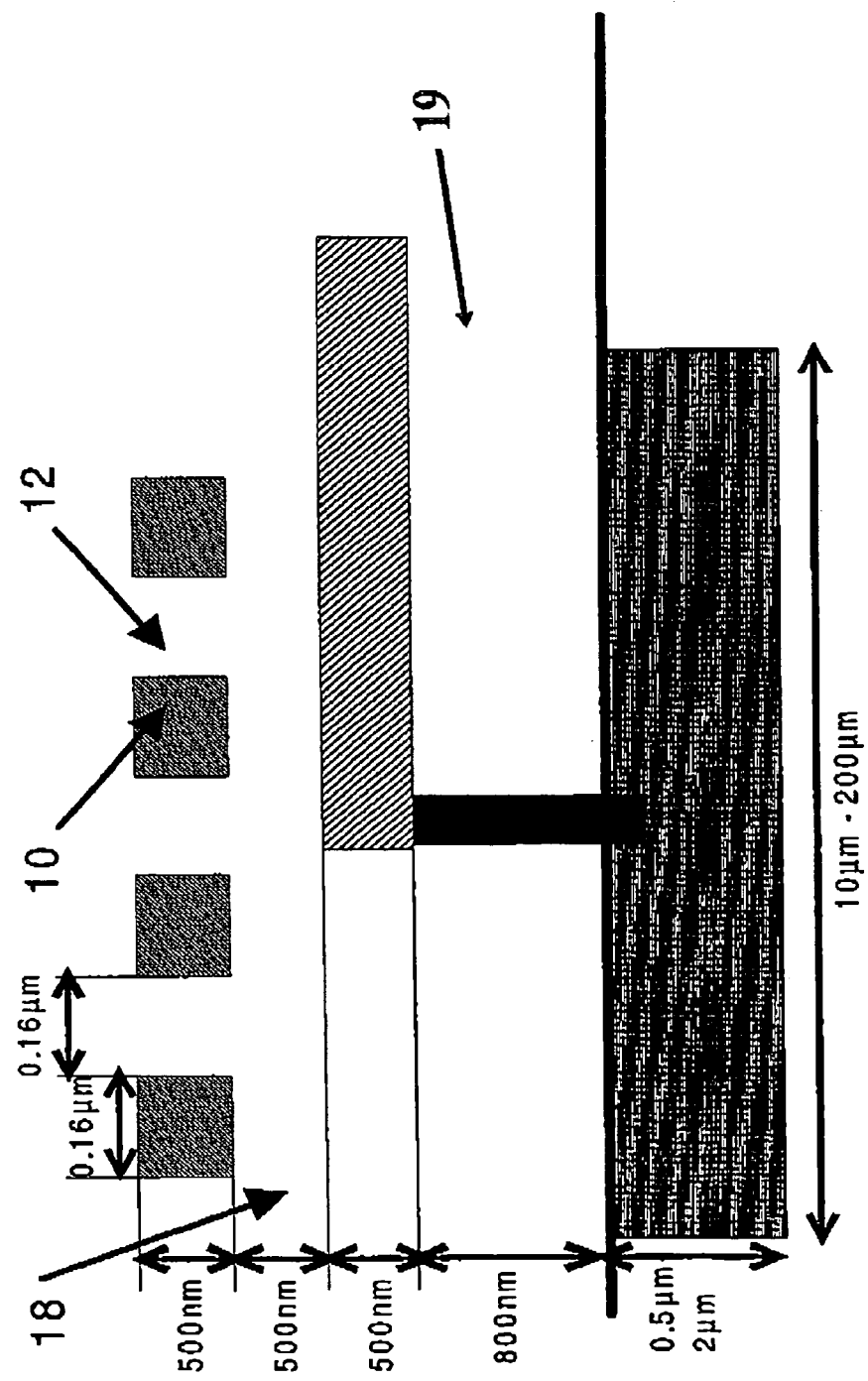
FIG. 2 is a schematic cross-sectional view taken across the line A—A' of FIG. 1.

The present invention provides for a polarization sensitive solid state image sensor comprising an integrated photodetector and polarizing assembly. An embodiment of such a sensor is illustrated in FIGS. 1 and 2. Advances in CMOS technology have resulted in smaller dimensions for transistor gates, for example, 0.35 μm, 0.18 μm, or 0.13 μm. Along with this, the dimensions of metal interconnects have also reduced in size, for example, 0.5μm, 0.32 μm, or 0.16 μm. The wavelength of light in air is between 0.45 μm and 0.65 μm. As the sizes of these metal structures is less than the wavelength of light, they are therefore suitable for diffractive-type optics. The short distance (1–3 μm, as seen in FIG. 2) between the metal layers and the surface of the silicon is too short to allow interference, thus preventing the use of diffractive optics. However, this is not an issue for polarizers.

A polarizing assembly 10 according to a first embodiment of the present invention is shown in FIGS. 1 and 2. An array of parallel metal lines 12 is provided having a width 14 of 0.16 μm, and are spaced apart by a spacing 16 of 0.16 μm. A pitch of the grid is defined as the summed width of the width 14 of one metal line 12 and the spacing 16 adjacent to that line. Thus, the pitch of the illustrated array is 0.32 μm.

As seen in FIG. 2, the metal lines 12 are formed directly on a dielectric layer 18 of a silicon photodetector 19. Thus, the image sensor produced comprises an integrated photodetector 19 and polarizing assembly 10. In this context, "integrated" is taken to mean that the polarizing assembly 10 is immovably attached in a fixed spatial relationship to a photodetector 19. These metal patterns can be produced very accurately as part of a normal manufacturing process, and thus the cost of incorporating a polarization assembly 10 is kept very low.

As the width 14 of the metal lines 12 and the spacing 16 between adjacent lines is equal, the illustrated array will allow approximately 50% of incident radiation to pass therethrough. It will be appreciated that the pitch can be varied by choosing different values of one or both of the width 14 of the metal lines 12 or the spacing 16 of the metal lines 12, to allow different proportions of incident light to pass through the array, as required.

Components of incident radiation having an electric field parallel to the array structure, i.e. parallel to the longitudinal axis of the metal lines 12, will pass relatively freely through the array. However, components of incident radiation having an electric field orthogonal to the array structure will collapse because the conducting properties of the metal lines 12 cause the electric field to collapse. It will be appreciated that any metal can be chosen, as long as it has a conductivity suitable to act effectively in an array as a polarizer of incident light.

The efficiency of the polarizing assembly 10 is optimal if the pitch of the array is less than one tenth of the wavelength of incident radiation. For visible light, an optimal pitch is then 460 nm/$(10N_{si})$=31.5 nm, where $N_{si}$ is the refractive index of silicon, having a typical value of 1.45.

Current high-volume manufacturing techniques cannot yet produce a structure this fine. However, the inventors have found that, surprisingly, a significant polarizing effect occurs with structures produced using a pitch which is much greater than this optimal pitch. Accordingly, a pitch of much greater than 30 nm can be used to provide a polarizing effect which is useful for production of a polarization sensitive image sensor. In this context, "much greater" than a particular value means that the pitch must be at least twice that particular value. In the illustrated embodiment, the pitch is approximately ten times the particular value, i.e. over 300 nm. The minimum allowable pitch will be governed by the manufacturing process.

The polarizing structure can formed on the surface of any type of silicon photodetector, but one of high sensitivity is preferred as the polarizer introduces a significant attenuation. For example, in the embodiment illustrated in FIG. 2, at least 50% of incident light is lost.

A technique which is particularly suitable for this method is a light to frequency (LTF) converter. Examples of LTF converters are product numbers TSL235, TSL245 and similar devices available from Texas Advanced Optoelectronic Solutions. These include a photodiode and a current to frequency converter integrated on the same CMOS IC.

LTF converters are particularly useful for the present application because they use a charge sensing technique. This permits the use of large area photodetectors, which collect more photons but have a large capacitance. More conventional readout techniques (e.g. 3 transistor) use a voltage sensing technique, so the large capacitance of the photodetector (the capacitance is proportional to its area) effectively cancels out the advantage of the greater number of photons collected by the larger area.

Figure 3:
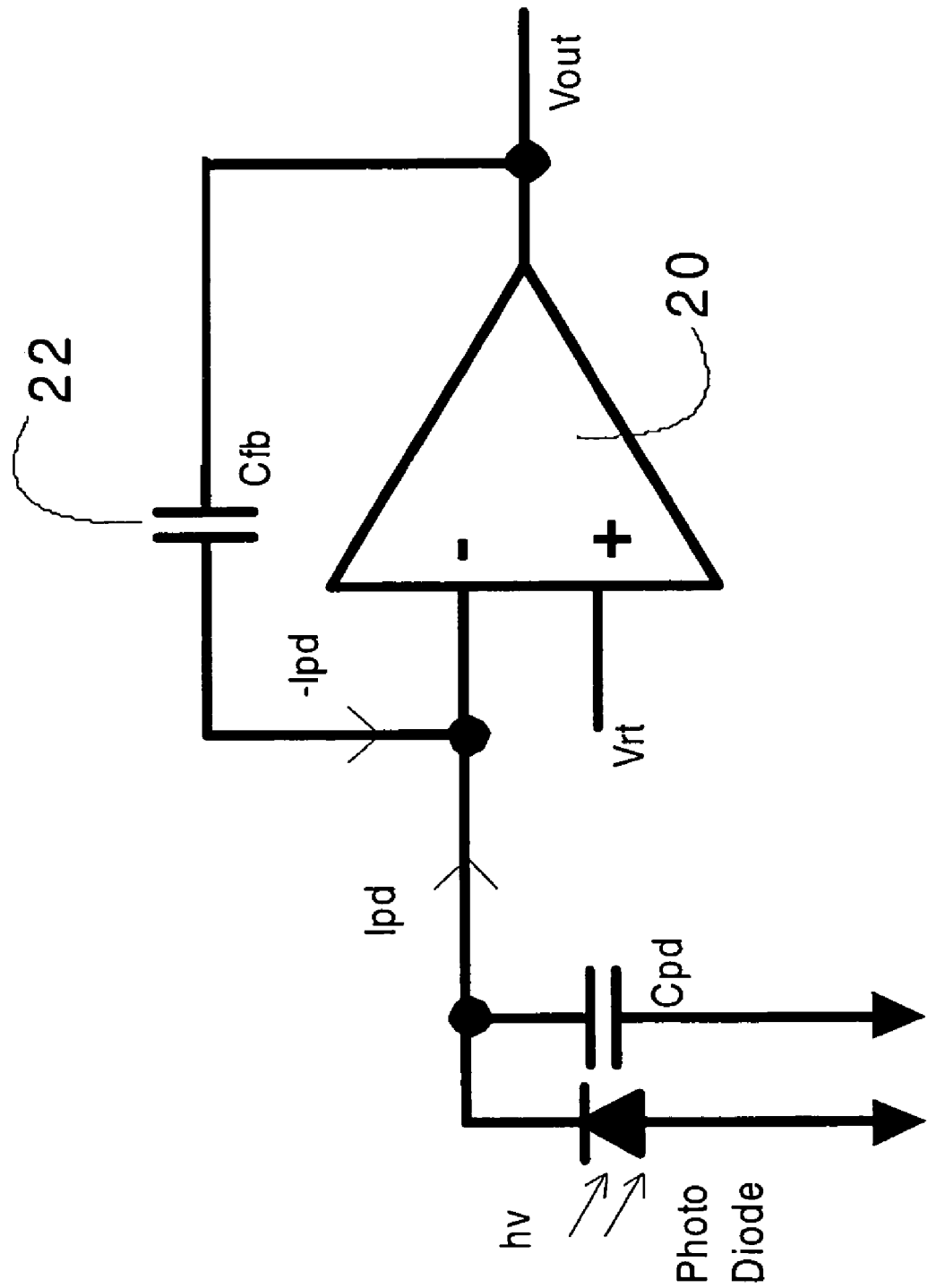
FIG. 3 is a schematic diagram illustrating an example of a charge amplifier for use with the present invention.

FIG. 3 illustrates a charge sensing amplifier that uses an operational amplifier 20 with a feedback capacitor, Cfb 22. The amplifier 20 has a very high input impedance and so no current flows into it. The output will change so that the inverting input remains at the same potential as the non-inverting input. In doing so, a current will flow through the feedback capacitor Cfb 22. This will be of exactly the same magnitude (but opposite sign) to the photocurrent Ipd. Vout=−Ipd×Tint/Cfb (equation 1), and so the output voltage is independent of the pixel's capacitance.

Figure 4:
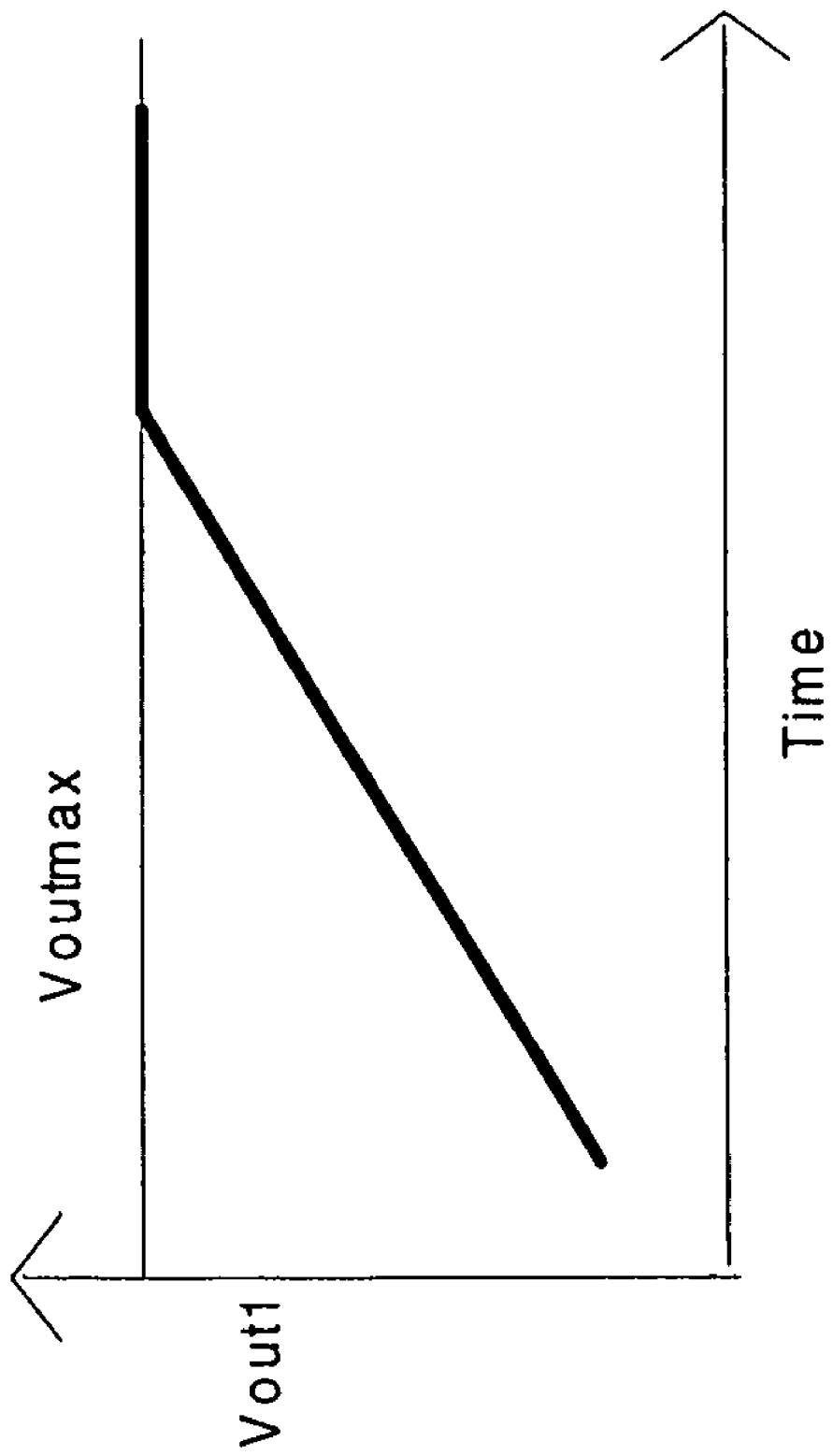
FIG. 4 is a timing diagram illustrating the variation of an output voltage of the charge amplifier of FIG. 3 over time.
Figure 5:
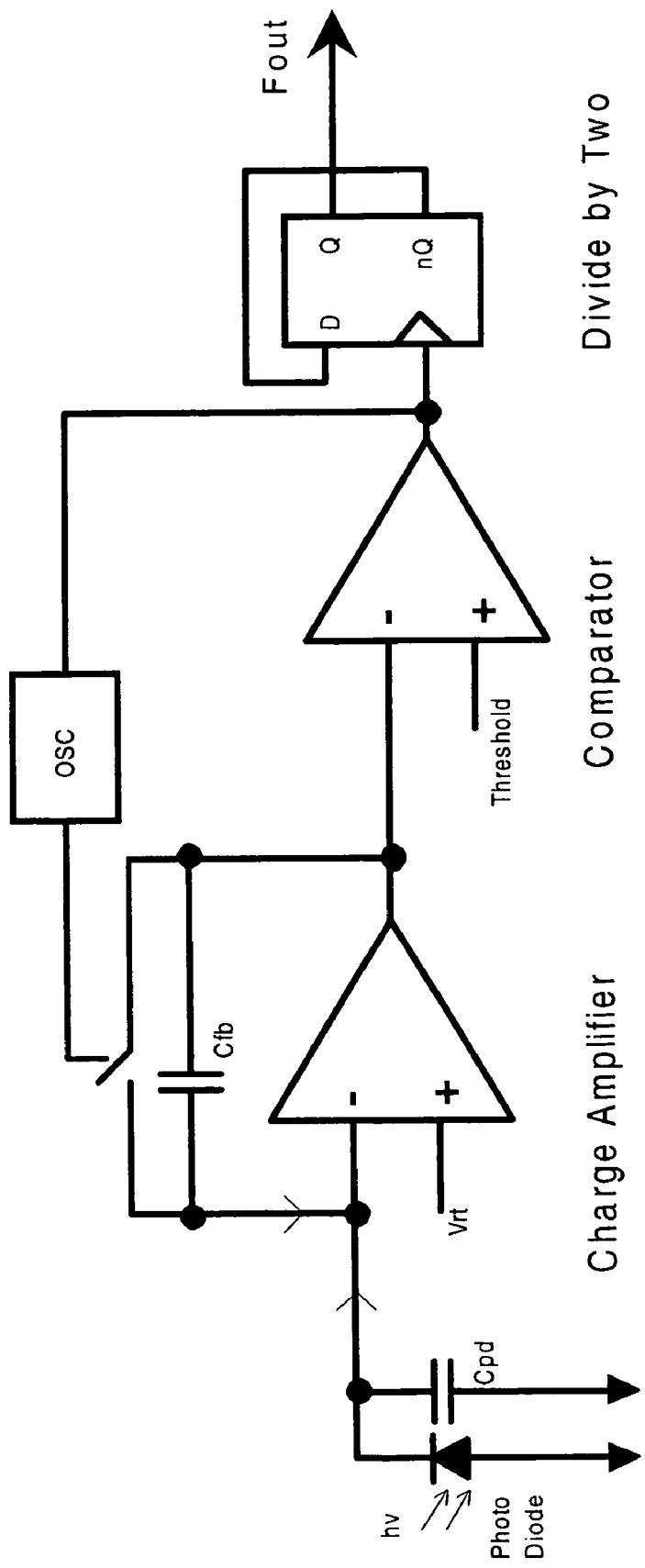
FIG. 5 is a schematic diagram illustrating an example of a light to frequency conversion circuit for use with the present invention.
Figure 6:
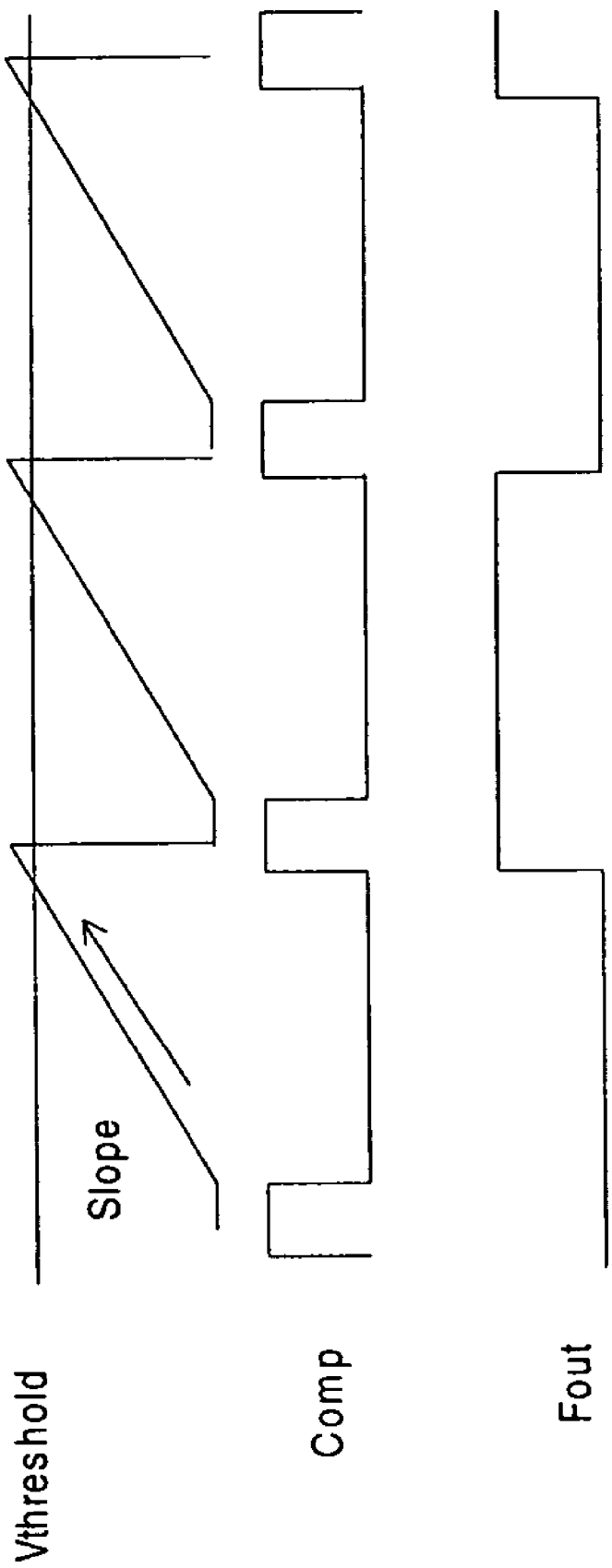
FIG. 6 is a waveform diagram illustrating exemplary waveforms generated by the light to frequency conversion circuit of FIG. 5.

Because of this, the architecture is very suitable for large photodiodes. The disadvantage is that the charge amplifier 20 needs to be reset periodically as the output voltage will swing outside the operating range of the amplifier 20, as shown in FIG. 4. This reset can be achieved as part of a system's AEC (automatic exposure control). A practical method for resetting the charge-amp's feedback capacitor 22 is shown in FIG. 5, the readout signals from which are illustrated in FIG. 6.

As shown in Equation 1, the slope of the charge-amplifier's 20 output is proportional to the light. Hence the frequency of the light to frequency conversion is also proportional to the light. Fout=Ipd/(2×Cfb×(Vthreshold−Vrt)) (equation 2).

The above described architecture provides a number of advantages, as follows: output signal is independent of photodiode capacitance/size; Feedback capacitance can be chosen or designed for application; System is auto-exposing; Output is digital and therefore immune to noise; ADC is included in the architecture; Digital signal is easy to measure over large dynamic range (e.g.120 dB).

Additionally, the above concepts can be applied in a manufacturing process to form a polarizing structure on selected portions of an image sensor. These portions may or may not cover the entire image sensing surface. Furthermore, the orientation of the lines that are formed can be predetermined and can be different for different portions of the image sensor, so that different polarizations can be detected. This polarization sensitive image sensor can be incorporated in a number of different products, which include but are not limited to, a chip or integrated circuit, an optical mouse, and a digital camera provided as a separate unit or as part of a mobile telephone or webcam.

It will be appreciated that standard techniques may be used by the skilled artisan to implement the invention in these and other ways. Various improvements and modifications can be made to the above without departing from the scope of the invention. In particular, an image sensor made in accordance with the principles of the invention may be incorporated in a product together with a non-polarized detector to gather information about ambient light.

That which is claimed is:

1. A polarization sensitive solid state image sensor comprising:
   a photodetector including a dielectric layer; and
   a polarizing assembly integrated with the photodetector and formed directly on the dielectric layer, and comprising a plurality of spaced-apart parallel lines and associated spaces therebetween, the lines having a pitch less than a wavelength in the visible light spectral range, the pitch being a sum of a width of one of the lines and a width of the associated space.

2. The image sensor of claim 1, wherein the pitch is greater than 30 nm.

3. The image sensor of claim 1, wherein the photodetector comprises a charge amplifier.

4. The image sensor of claim 1, wherein the metal lines are spaced apart by a distance equal to the width of the metal line.

5. An electronic device comprising:
   a polarization sensitive solid state image sensor including
      a photodetector including a dielectric layer, and
      a polarizing assembly integrated with the photodetector and formed directly on the dielectric layer, and comprising a plurality of spaced-apart parallel lines and associated spaces therebetween, the lines having a pitch less than a wavelength in the visible light spectral range, the pitch being a sum of a width of one of the lines and a width of the associated space.

6. The electronic device of claim 5, wherein the electronic device comprises an integrated circuit.

7. The electronic device of claim 5, wherein the electronic device comprises an optical mouse.

8. The electronic device of claim 5, wherein the electronic device comprises a digital camera.

9. The electronic device of claim 5, wherein the electronic device comprises a mobile telephone.

10. The electronic device of claim 5, wherein the metal lines are spaced apart by a distance equal to the width of the metal line.

11. A method of forming a polarization sensitive solid state image sensor comprising:

forming a polarizing assembly integrated with a photodetector;

the photodetector including a dielectric layer, and the polarizing assembly being formed directly on the dielectric layer, and comprising a plurality of spaced-apart parallel metal lines and associated spaces therebetween, the metal lines having a pitch less than a wavelength in the visible light spectral range, the pitch being a sum of a width of one of the metal lines and a width of the associated space.

12. The method of claim 11, wherein the metal lines are spaced apart by a distance equal to the width of the metal line.

13. The method of claim 11, wherein the plurality of parallel metal lines are formed by at least one of a lithographic and etching process.

* * * * *